(12) United States Patent
Misaki

(10) Patent No.: US 7,795,690 B2
(45) Date of Patent: Sep. 14, 2010

(54) THIN FILM TRANSISTOR SUBSTRATE AND METHOD OF FABRICATING THE SAME

(75) Inventor: Katsunori Misaki, Tottori (JP)

(73) Assignee: Sharp Kabushiki Kaisha, Osaka (JP)

( * ) Notice: Subject to any disclaimer, the term of this patent is extended or adjusted under 35 U.S.C. 154(b) by 1149 days.

(21) Appl. No.: 11/438,319

(22) Filed: May 23, 2006

(65) Prior Publication Data

US 2006/0281317 A1      Dec. 14, 2006

(30) Foreign Application Priority Data

May 24, 2005     (JP)  .............................. 2005-151574

(51) Int. Cl.
*H01L 23/62*   (2006.01)
(52) U.S. Cl. ................ 257/388; 257/257; 257/290; 257/750; 257/757; 257/765; 257/E29.134
(58) Field of Classification Search ......... 257/765–767, 257/257, 290, 388, 750, 757
See application file for complete search history.

(56) References Cited

U.S. PATENT DOCUMENTS

| 5,939,763 A * | 8/1999 | Hao et al. ................ 257/411 |
|---|---|---|
| 6,255,706 B1 * | 7/2001 | Watanabe et al. ........... 257/412 |
| 6,376,861 B1 * | 4/2002 | Yaegashi et al. ............... 257/59 |
| 2005/0035352 A1 * | 2/2005 | Onizuka ....................... 257/72 |

FOREIGN PATENT DOCUMENTS

| JP | 2000-208773 A | 7/2000 |
|---|---|---|
| JP | 2001-223365 A | 8/2001 |

* cited by examiner

*Primary Examiner*—Wai-Sing Louie
(74) *Attorney, Agent, or Firm*—Birch, Stewart, Kolasch & Birch, LLP

(57) ABSTRACT

The invention relates to a thin film transistor substrate for use in a liquid crystal display device and a method of fabricating the same, and an object is to provide a thin film transistor substrate which can ensure high reliability even though a low resistance metal is used in a material for a gate electrode and a predetermined wiring and a method of fabricating the same. A TFT substrate has a gate electrode in a multilayer structure configured of an AlN film as a nitrogen containing layer, an Al film as a main wiring layer and an upper wiring layer formed of an MoN film and an Mo film. On the gate electrode whose side surface inclines gently, a gate insulating film of excellent film quality is formed.

6 Claims, 9 Drawing Sheets

THIN FILM TRANSISTOR SUBSTRATE AND METHOD OF FABRICATING THE SAME

BACKGROUND OF THE INVENTION

1. Field of the Invention

The present invention relates to a thin film transistor substrate for use in a liquid crystal display device and a method of fabricating the same.

2. Description of the Related Art

A liquid crystal display device has advantages that it is thin and lightweight and that it can be driven at low voltage and low current consumption. In recent years, it is widely used as a display device for a personal computer and for a television receiver, etc.

Generally, a liquid crystal display panel of the liquid crystal display device is configured in which liquid crystals are sealed between two transparent glass substrates. On one surface of the surfaces facing each other of the two glass substrates, a black matrix, a color filter, a opposite electrode, an alignment layer, etc. are formed, whereas on the other surface, thin film transistors, pixel electrodes and an alignment layer are formed.

On the surfaces other than the surfaces facing to each other, a polarizer is attached. When the polarization axes of the two polarizers are orthogonalized to each other, a liquid crystal display device in the normally white mode is configured. More specifically, light is transmitted in the state in which no electric field is applied to liquid crystals, whereas light is blocked when an electric field is applied to liquid crystals. On the other hand, when the polarization axes of the two polarizers are disposed in parallel with each other, a liquid crystal display device in the normally black mode is configured. More specifically, light is blocked in the state in which no electric field is applied to liquid crystals, whereas light is transmitted when an electric field is applied to liquid crystals.

A liquid crystal display device before will be described with reference to FIGS. 11 to 13. FIG. 11 is a plan view illustrating a inverted staggered active matrix thin film transistor (TFT) substrate, and FIGS. 12 and 13 are cross sections of a dashed line A-A' shown in FIG. 11. As shown in FIGS. 11 to 13, on a glass substrate 3, a gate electrode 27 formed of an Al film 50, an MoN film 54 and an Mo film 53 is formed. The gate electrode 27 is connected to a gate bus line 6 formed of the same conductive films.

The reason why Al is used as a material for the gate electrode 27 is that Al is a material having a low electric resistance. In the conventional liquid crystal display device, a high melting point metal having a relatively high electric resistance such as Cr is used for the gate electrode material, but in recent years, a low resistance material such as Al is used in order to cope with an increase in size and high definition of the liquid crystal display device.

The reason why the MoN film 54 and the Mo film 53 are formed on the Al film 50 is that Mo is a material that has a high heat resistance property and allows the Al film 50 to have an excellent electric contact in connecting it to other wirings. The gate bus line 6 is connected to a predetermined driver IC through ITO (Indium Tin Oxide) in an area not shown, and it can have an excellent electric contact because it is connected to other wirings through the Mo film 53. In addition, the Al film 50 tends to cause a hillock due to heating in the post-process to deteriorate the withstand voltage of a gate insulating film 32 that is contacted with the Al wiring. In order to prevent this event, a structure is provided in which a high melting point metal such as Mo is used for a cap.

On the glass substrate 3 formed with the gate electrode 27, the gate insulating film 32 is formed. On the gate insulating film 32, an amorphous silicon film 34 is formed. On the amorphous silicon film 34, an $n^+$-amorphous silicon film 36 is formed. On the $n^+$-amorphous silicon film 36, a source electrode 28 and a drain electrode 63 (see FIG. 11) formed of an MoN film 64, an Al film 65 and an MoN film 66 are formed. The drain electrode 63 also serves as a data bus line 8.

On a layer above the source electrode 28 and the drain electrode 63, a protective film 42 is formed. As shown in FIG. 11, the protective film 42 is formed with a contact hole 46 which reaches a pixel electrode 37. On the protective film 42, the pixel electrode 37 formed of ITO connected through the contact hole 46 is formed. Since the Al film 65 is connected to the pixel electrode 37 through the MoN film 66, it has an excellent electric contact. As described above, since Al of a low resistance metal is used for materials of the gate bus line 6 and the data bus line 8 in the liquid crystal display device, it can contribute to an increase in size and high definition of the liquid crystal display device.

Patent Reference 1: JP-A-2000-208773
Patent Reference 2: JP-A-2001-223365

SUMMARY OF THE INVENTION

However, in the conventional liquid crystal display device shown in FIGS. 12 and 13, in the drawing, since the side of the Al film 50 of the gate electrode 27 is steep, the step coverage of the gate insulating film 32 is not sufficient. As shown by a broken line in the drawing, the film quality of the gate insulating film 32 is discontinued near the side of the Al film 50. Thus, it has a problem that the withstand voltage of the gate insulating film 32 is decreased.

An object of the invention is to provide a thin film transistor substrate which can ensure high reliability even though a low resistance metal is used for materials of a gate electrode and a predetermined wiring, and a method of fabricating the same.

The object can be achieved by a thin film transistor substrate including: on an insulating substrate, at least a gate electrode, a scanning line connected to the gate electrode, a gate insulating film, a semiconductor layer, a source electrode, a drain electrode, and a signal line connected to the drain electrode, wherein the gate electrode and/or the scanning line has a multilayer structure configured of a main wiring layer formed of a metal selected from Al, Ag and Cu or an alloy having a main component of Al, Ag and Cu, and of a nitrogen containing layer which is disposed below the main wiring layer and has nitrogen contained in the main wiring layer.

The thin film transistor substrate according to the invention is characterized in that the nitrogen containing layer has different nitriding ratios in the layer.

The thin film transistor substrate according to the invention is characterized in that the nitrogen containing layer is formed to increase a nitriding ratio toward the lower layer.

In addition, the object can be achieved by a thin film transistor substrate including: on an insulating substrate, at least a gate electrode, a scanning line connected to the gate electrode, a gate insulating film, a semiconductor layer, a source electrode, a drain electrode, and a signal line connected to the drain electrode, wherein the gate electrode and/or the scanning line is a main wiring layer which is formed of a metal selected from Al, Ag and Cu or an alloy having a main component of Al, Ag and Cu, which contains nitrogen, which has different nitriding ratios in the main wiring layer, and in which a nitriding ratio increases toward the lower layer.

The thin film transistor substrate according to the invention is characterized in that the gate electrode and the scanning line have a multilayer structure in which at least one layer of upper wiring layers of a metal selected from Ti, Mo, W, Cr and Ta, or an alloy of Ti, Mo, W, Cr and Ta, or a material having nitrogen contained in Ti, Mo, W, Cr and Ta is further disposed on the main wiring layer.

The thin film transistor substrate according to the invention is characterized in that the gate electrode and the scanning line have a topmost layer which is an oxidized layer of the main wiring layer.

In addition, the object can be achieved by a method of fabricating a thin film transistor substrate having on an insulating substrate, at least a gate electrode, a scanning line connected to the gate electrode, a gate insulating film, a semiconductor layer, a source electrode, a drain electrode, and a signal line connected to the drain electrode, the method including: forming on the insulating substrate a nitrogen containing layer which has nitrogen contained in a metal selected from Al, Ag and Cu or an alloy having a main component of Al, Ag and Cu; forming on the nitrogen containing layer a main wiring layer which is formed of a metal selected from Al, Ag and Cu or an alloy having a main component of Al, Ag and Cu; forming on the main wiring layer at least one layer of an upper wiring layers of a metal selected from Ti, Mo, W, Cr and Ta, or an alloy of Ti, Mo, W, Cr and Ta, or a material having nitrogen contained in Ti, Mo, W, Cr and Ta; and forming the gate electrode and/or the scanning line in a multilayer structure by patterning the nitrogen containing layer, the main wiring layer and the upper wiring layer.

In addition, the object can be achieved by a method of fabricating a thin film transistor substrate having on an insulating substrate, at least a gate electrode, a scanning line connected to the gate electrode, a gate insulating film, a semiconductor layer, a source electrode, a drain electrode, and a signal line connected to the drain electrode, the method comprising: forming on the insulating substrate a nitrogen containing layer which has nitrogen contained in a main wiring layer which is formed of a metal selected from Al, Ag and Cu or an alloy having a main component of Al, Ag and Cu; forming on the nitrogen containing layer at least one layer of upper wiring layers of a metal selected from Ti, Mo, W, Cr and Ta, or an alloy of Ti, Mo, W, Cr and Ta, or a material having nitrogen contained in Ti, Mo, W, Cr and Ta; and forming the gate electrode and/or the scanning line in a multilayer structure by patterning the nitrogen containing layer, the main wiring layer and the upper wiring layer.

The method of fabricating the thin film transistor substrate according to the invention is characterized in that the nitrogen containing layer, the main wiring layer and the upper wiring layer are patterned at the same time with a same etchant to form the gate electrode and/or the scanning line.

The method of fabricating the thin film transistor substrate according to the invention is characterized in that the upper wiring layer is patterned by dry etching; and the nitrogen containing layer and the main wiring layer are patterned at the same time by wet etching to form the gate electrode and/or the scanning line.

The method of fabricating the thin film transistor substrate according to the invention is characterized in that the nitrogen containing layer, the main wiring layer and the upper wiring layer are patterned with a different etchant by wet etching to form the gate electrode and/or the scanning line.

In addition, the object can be achieved by a method of fabricating a thin film transistor substrate having on an insulating substrate, at least a gate electrode, a scanning line connected to the gate electrode, a gate insulating film, a semiconductor layer, a source electrode, a drain electrode, and a signal line connected to the drain electrode, the method including: forming on the insulating substrate a nitrogen containing layer which has nitrogen contained in a metal selected from Al, Ag and Cu or an alloy having a main component of Al, Ag and Cu; forming an oxidized layer by oxidizing a topmost layer of the nitrogen containing layer; and forming the gate electrode and/or the scanning line in a multilayer structure by patterning the nitrogen containing layer and the oxidized layer.

The method of fabricating the thin film transistor substrate according to the invention is characterized in that the oxide film is formed by at least any one of an anodic oxidation process, an ashing process, a high-pressure oxidation process and a thermal oxidation process.

In addition, the object can be achieved by a method of fabricating a thin film transistor substrate having on an insulating substrate, at least a gate electrode, a scanning line connected to the gate electrode, a gate insulating film, a semiconductor layer, a source electrode, a drain electrode, and a signal line connected to the drain electrode, the method including: forming on the insulating substrate a main wiring layer formed of a metal selected from Al and Ag or an alloy having a main component of Al and Ag; forming on the main wiring layer at least one layer of upper wiring layers of an Mo metal, an alloy containing Mo, or a material having nitrogen contained in Mo; shower etching the main wiring layer and the upper wiring layer; and forming the gate electrode and/or the scanning line in a multilayer structure by patterning the main wiring layer and the upper wiring layer at the same time by dip etching under an etching condition which satisfies a relationship:

$$b \geq 2.7a,$$

where an etching rate of the main wiring layer is a, and an etching rate of the upper wiring layer is b.

The method of fabricating the thin film transistor substrate according to the invention is characterized in that the main wiring layer and the upper wiring layer are patterned at the same time to form the gate electrode and/or the scanning line under an etching condition which satisfies a relationship:

$$t \geq D/a,$$

where an etching time for dip etching is t, and a layer thickness of the main wiring layer is D.

According to the invention, the thin film transistor substrate can be fabricated which can ensure high reliability even though a low resistance metal is used in a material for a gate electrode and a predetermined wiring.

BRIEF DESCRIPTION OF THE DRAWINGS

The teachings of the invention can be readily understood by considering the following detailed description in conjunction with the accompanying drawings, in which.

DESCRIPTION OF THE PREFERRED EMBODIMENT

First Embodiment

Figure 1:
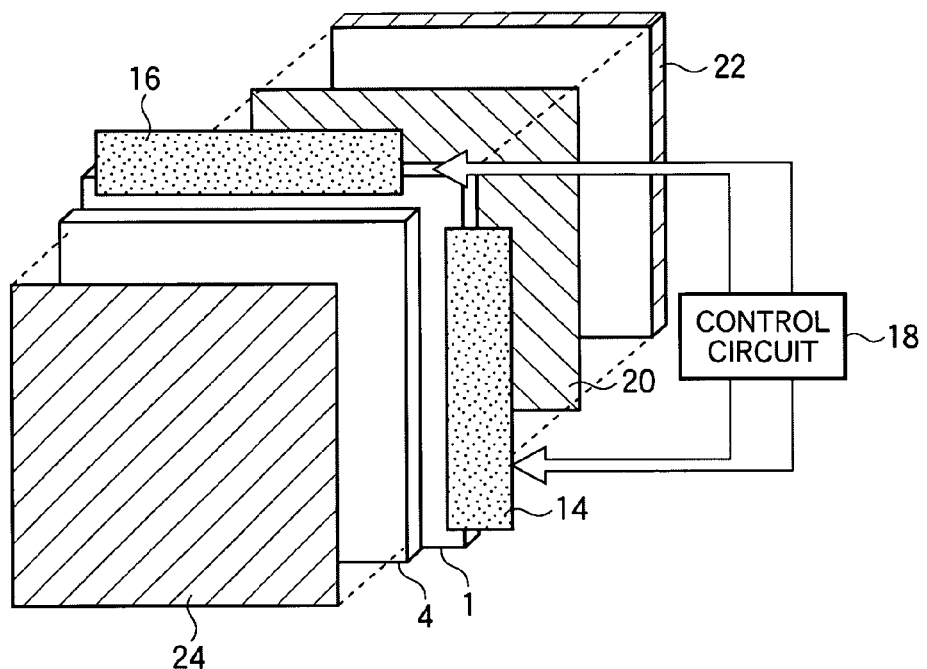
FIG. 1 is a diagram illustrating the schematic configuration of a liquid crystal display device provided with a TFT substrate 1 of a first embodiment according to the invention.
Figure 2:
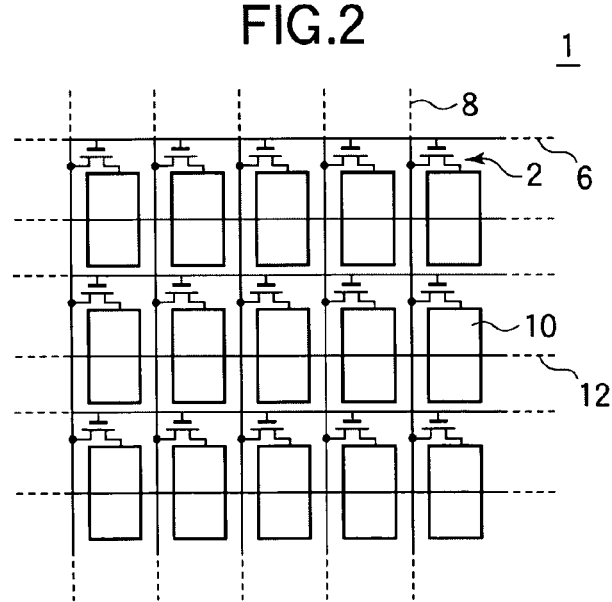
FIG. 2 is a diagram illustrating the plane pixel configuration of the TFT substrate 1 of the first embodiment according to the invention.
Figure 3:
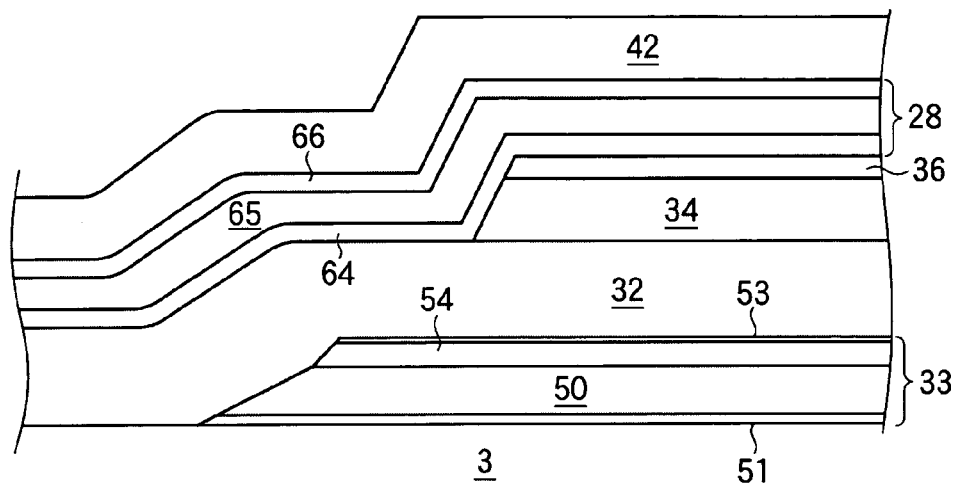
FIG. 3 is a diagram illustrating the sectional configuration of a single pixel of the TFT substrate 1 of the first embodiment according to the invention.

A thin film transistor substrate and a method of fabricating the same of a first embodiment according to the invention will be described with reference to FIGS. 1 to 3. First, the schematic configuration of a liquid crystal display device provided with the thin film transistor substrate (TFT substrate) of the embodiment will be described with reference to FIGS. 1 and 2. FIG. 1 shows the schematic configuration of the liquid crystal display device of the embodiment. FIG. 2 shows the pixel configuration of a TFT substrate 1 of the embodiment. The plane layout of a single pixel of the TFT substrate 1 is the same as that of the TFT substrate before.

As shown in FIGS. 1 and 2, the liquid crystal display device has the TFT substrate 1 provided with a plurality of gate bus lines (scanning lines) 6 and a plurality of drain bus lines (signal lines) 8 which are formed as they intersect with each other through an insulating film, a TFT 2 and a pixel electrode 10 which are formed at every pixel, and a storage capacitor bus line 12 which is formed nearly at the center between adjacent gate bus lines 6 in parallel with each other. In addition, the liquid crystal display device is provided with a opposite substrate 4 which faces the TFT substrate 1 at a predetermined cell gap. Between the TFT substrate 1 and the opposite substrate 4, liquid crystals having negative dielectric anisotropy, for example, are sealed. On the surface of the opposite substrate 4 on the liquid crystal side, a color filter (CF) and a common electrode are formed.

The TFT substrate 1 is connected to a gate bus line drive circuit 14 on which a driver IC is mounted to drive a plurality of the gate bus lines 6, and a drain bus line drive circuit 16 on which a driver IC is mounted to drive a plurality of the drain bus lines 8. These drive circuits 14 and 16 output a scanning signal to a predetermined gate bus line 6 based on a control signal outputted from a control circuit 18, and output a gray scale signal to a plurality of the drain bus lines 8. On the surface opposite to the surface of the TFT substrate 1 on the liquid crystal side, a polarizer 20 is disposed. On the surface opposite to the surface of the opposite substrate 4 on the liquid crystal side, a polarizer 24 is disposed in crossed Nicol with the polarizer 20. On the surface opposite to the surface of the polarizer 20 on the TFT substrate 1, a backlight unit 22 is placed.

Figure 11:
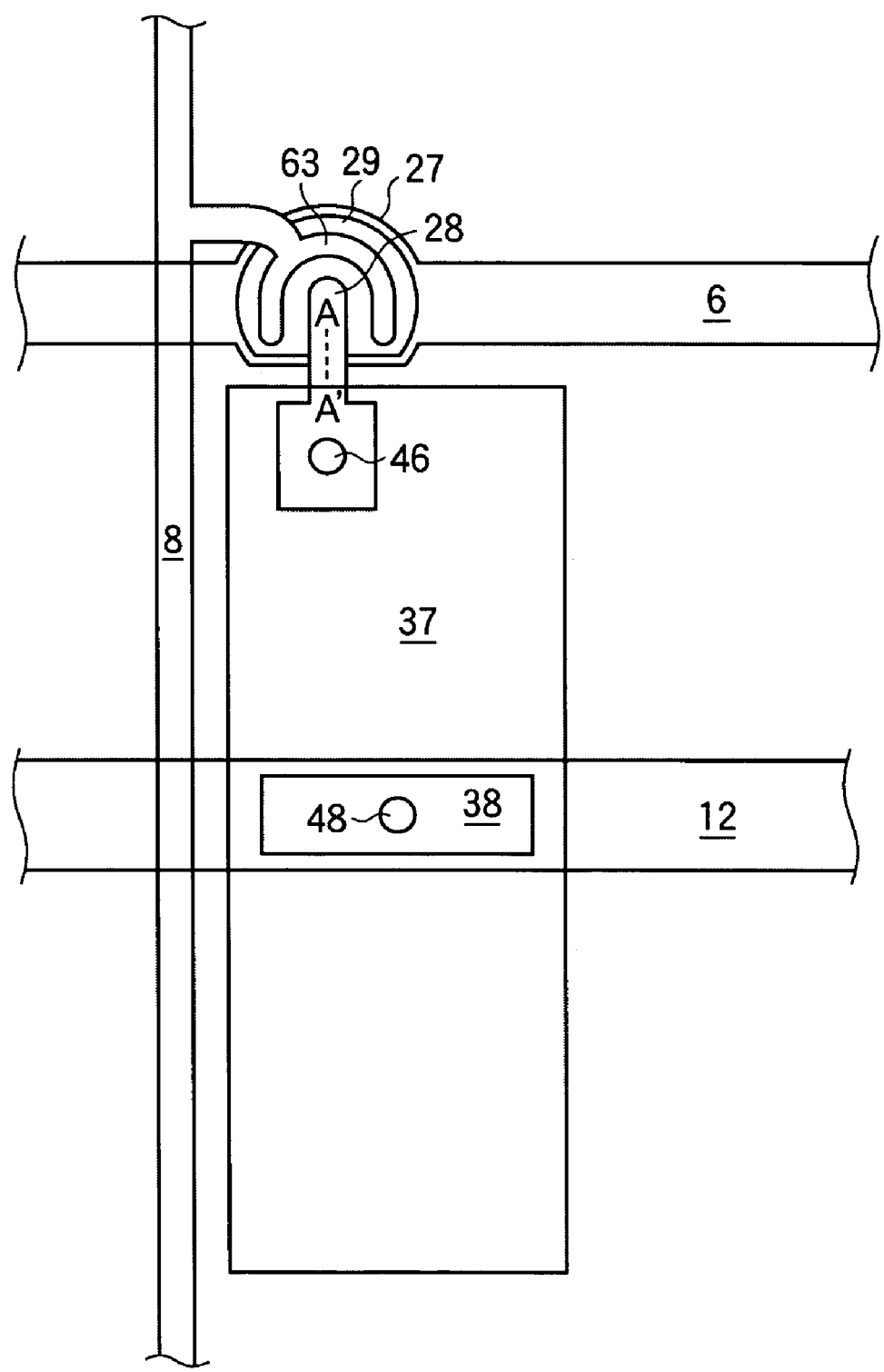
FIG. 11 is a diagram illustrating the plane pixel configuration of a TFT substrate before.
Figure 12:
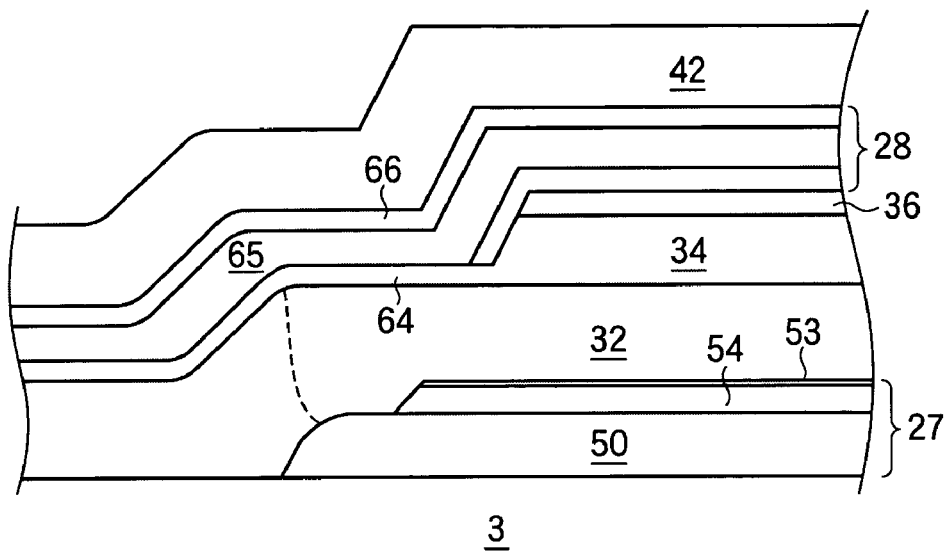
FIG. 12 is a diagram illustrating the sectional configuration of a single pixel of the TFT substrate before.
Figure 13:
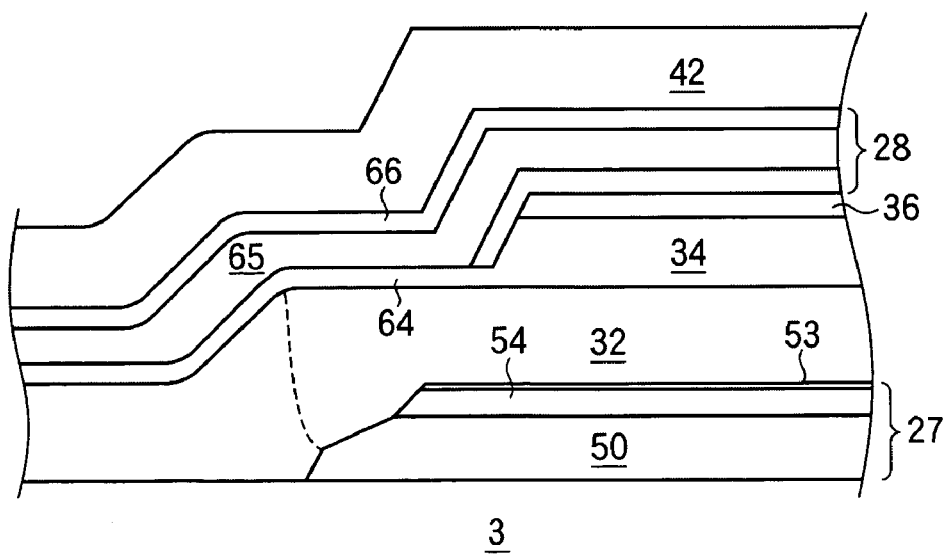
FIG. 13 is a diagram illustrating the sectional configuration of a single pixel of the TFT substrate before.

Next, the sectional configuration of the TFT substrate 1 and a method of fabricating the TFT substrate 1 will be described with reference to FIG. 3. FIG. 3 shows a cross section that the TFT substrate 1 is sectioned on a dashed line A-A' shown in FIG. 11.

First, an AlN film 51 having a film thickness of 50 nm is formed as a nitrogen containing layer on throughout the surface of the glass substrate 3 by reactive sputtering using $N_2$ gas. For the film deposition condition, the flow ratio of Ar gas to $N_2$ gas is set to 8:2, for example.

Subsequently, an Al film 50 having a film thickness of 150 nm, for example, is formed as a main wiring layer on throughout the surface by sputtering. Then, an MoN film 54 having a film thickness of 70 nm is formed by reactive sputtering using $N_2$ gas. For the film deposition condition, the flow ratio of Ar gas to $N_2$ gas is set to 7:3, for example. Subsequently, an Mo film 53 having a film thickness of 15 nm is formed on throughout the surface by sputtering. Thus, an upper wiring layer formed of the MoN film 54 and the Mo film 53 is formed. In this manner, the gate electrode 33 and the gate bus line (scanning line) 6 in the multilayer structure is configured (see FIG. 11).

Then, a photoresist film is formed on throughout the surface by spin coating. Subsequently, a photolithography technique is used to pattern the photoresist film. Then, the AlN film 51, the Al film 50, the MoN film 54 and the Mo film 53 are wet etched at the same time. For an etching solution, an aqueous solution mixed with 67.3 wt % of phosphoric acid, 5.2 wt % of nitric acid and 10 wt % of acetic acid, for example, is used. With the use of the etching solution like this, the gate electrode 33 can be formed in which the side surface is shaped to incline gently in FIG. 3.

Subsequently, the photoresist mask is removed by a resist remover. Then, a gate insulating film 32 formed of SiN having a film thickness of 350 nm is formed on throughout the surface by plasma CVD (Plasma Enhanced Chemical Vapor Deposition). Since the gate insulating film 32 is formed on the gate electrode 33 whose side surface inclines gently, it has excellent film quality. Therefore, the gate insulating film 32 of high reliability and high withstand voltage can be formed.

Subsequently, an amorphous silicon film 34 having a film thickness of 120 nm is formed on throughout the surface by plasma CVD. Then, an $n^+$-amorphous silicon film 36 having a film thickness of 30 nm is formed on throughout the surface by plasma CVD. Subsequently, a photoresist film is formed on throughout the surface by spin coating. After that, a photolithography technique is used to pattern the photoresist film. In this manner, a photoresist mask to pattern the $n^+$-amorphous silicon film 36 is formed.

Then, the $n^+$-amorphous silicon film 36 is etched by dry etching. Subsequently, the photoresist mask is removed by a resist remover. Then, an MoN film 64 having a film thickness of 50 nm is formed by sputtering. Subsequently, an Al film 65 having a film thickness of 100 nm is formed by sputtering. Then, an MoN film 66 having a film thickness of 40 nm is formed by sputtering.

Subsequently, a photoresist film is formed on throughout the surface by spin coating. After that, a photolithography technique is used to pattern the photoresist film. In this manner, a photoresist mask to pattern the source electrode 28 and the drain electrode 63 is formed. Then, the MoN film 64, the Al film 65 and the MoN film 66 are etched at the same time. For an etching solution, for example, an aqueous solution mixed with 67.3 wt % of phosphoric acid, 5.2 wt % of nitric acid and 10 wt % of acetic acid is used. Furthermore, a gas of fluorine plus chlorine is used to dry etch the n$^+$-amorphous silicon film 36 for half etching the amorphous silicon film 34. In this manner, the source electrode 28 and the drain electrode 63 are formed.

Subsequently, the photoresist mask is removed by a resist remover. Then, a protective film (final protective film) 42 formed of SiN having a film thickness of 330 nm is formed by plasma CVD. Subsequently, a photoresist film is formed on throughout the surface by spin coating. After that, a photolithography technique is used to pattern the photoresist film to form a photoresist mask having an opening formed therein. Subsequently, the photoresist mask is used to etch the protective film 42 to form a contact hole 46 which reaches the source electrode 28 (see FIG. 11). Then, the photoresist mask is removed by a resist remover.

Subsequently, an ITO (Indium Tin oxide) film having a film thickness of 70 nm is formed on throughout the surface by sputtering. Then, a photoresist film is formed on throughout the surface by spin coating. Subsequently, a photolithography technique is used to pattern the photoresist film. In this manner, a photoresist mask to form a pixel electrode 37 is formed. Subsequently, the ITO film is etched to form the pixel electrode 37 formed of ITO. The Al film 65 is connected to the pixel electrode 37 through the MoN film 66 and the contact hole 46, and an excellent electric contact can be provided between the Al film 65 and the pixel electrode 37. Subsequently, the photoresist mask is removed by a resist remover. In this manner, the TFT substrate 1 of the embodiment is formed.

As described above, since the TFT substrate 1 of the embodiment can form the gate insulating film 32 on the gate electrode 33 whose side surface inclines gently, it can prevent the film quality of the gate insulating film 32 from being discontinued near the side of the gate electrode 33. Accordingly, the gate insulating film 32 of high withstand voltage and high reliability can be obtained, and the reliability of the TFT substrate 1 can be improved.

Second Embodiment

Figure 4:
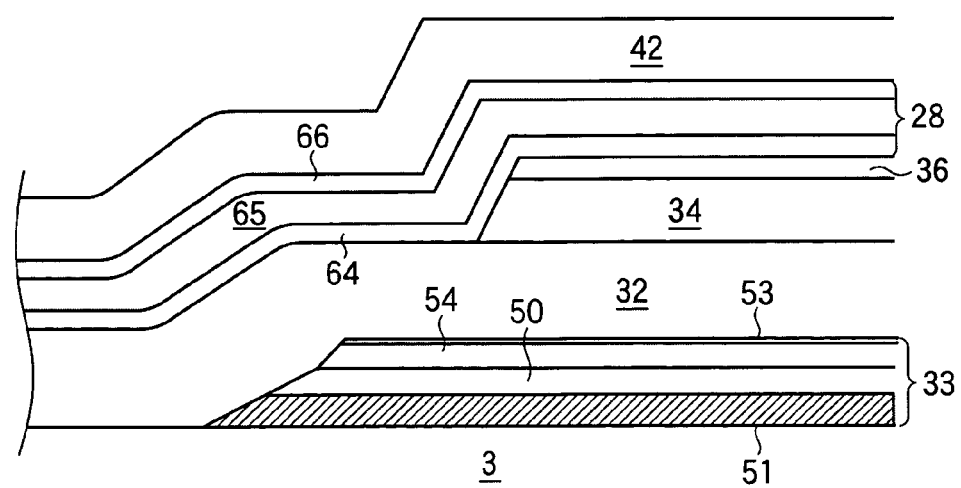
FIG. 4 is a diagram illustrating the sectional configuration of a single pixel of a TFT substrate 1 of a second embodiment according to the invention.

Next, a thin film transistor substrate and a method of fabricating the same of a second embodiment according to the invention will be described with reference to FIG. 4. The plane pixel configuration of a TFT substrate 1 and the schematic configuration of a liquid crystal display device of the embodiment are the same as those of the embodiment above, omitting the description. FIG. 4 shows a cross section illustrating the TFT substrate 1 of the embodiment sectioned at a dashed line A-A' shown in FIG. 11.

First, an AlN film 51 is formed as a nitrogen containing layer having a film thickness of 100 nm, for example, on throughout the surface of a glass substrate 3 by reactive sputtering using N$_2$ gas. For the film deposition condition, the flow ratio of Ar gas to N$_2$ gas is changed over time. For example, the flow ratio of Ar gas to N$_2$ gas is changed from Ar gas to N$_2$ gas=6:4 to 10:0. Thus, the AlN film 51 has a nitriding ratio increasing toward the glass substrate 3 side.

Subsequently, an Al film 50 is formed as a main wiring layer having a film thickness of 100 nm, for example, on throughout the surface by sputtering. Then, an MoN film 54 having a film thickness of 70 nm is formed by reactive sputtering using N$_2$ gas. For the film deposition condition, the flow ratio of Ar gas to N$_2$ gas is set to 7:3, for example. Subsequently, an Mo film 53 having a film thickness of 15 nm is formed on throughout the surface by sputtering. Thus, an upper wiring layer formed of the MoN film 54 and the Mo film 53 is formed. In this manner, a gate electrode 33 and a gate bus line (scanning line) 6 in the multilayer structure are configured (see FIG. 11).

Subsequently, a photoresist film is formed on throughout the surface by spin coating. Then, a photolithography technique is used to pattern the photoresist film. Subsequently, the AlN film 51, the Al film 50, the MoN film 54 and the Mo film 53 are wet etched at the same time. For an etching solution, for example, an aqueous solution mixed with 67.3 wt % of phosphoric acid, 5.2 wt % of nitric acid and 10 wt % of acetic acid is used. With the use of the etching solution like this, the gate electrode 33 can be formed in which the side is shaped to incline gently in FIG. 4.

Subsequently, the photoresist mask is removed by a resist remover. Then, a gate insulating film 32 formed of SiN having a film thickness of 350 nm is formed on throughout the surface by plasma CVD. Since the gate insulating film 32 is formed on the gate electrode 33 whose side surface inclines gently, the gate insulating film 32 of excellent film quality can be obtained. Therefore, the gate insulating film 32 of high reliability and high withstand voltage can be formed.

Subsequently, an amorphous silicon film 34 having a film thickness of 120 nm is formed on throughout the surface by plasma CVD. Then, an n$^+$-amorphous silicon film 36 having a film thickness of 30 nm is formed on throughout the surface by plasma CVD. Subsequently, a photoresist film is formed on throughout the surface by spin coating. After that, a photolithography technique is used to pattern the photoresist film. In this manner, a photoresist mask is formed to pattern the n$^+$-amorphous silicon film 36.

Subsequently, the n$^+$-amorphous silicon film 36 is etched by dry etching. Then, the photoresist mask is removed by a resist remover. Subsequently, an MoN film 64 having a film thickness of 50 nm is formed by sputtering. Then, an Al film 65 having a film thickness of 100 nm is formed by sputtering. Subsequently, an MoN film 66 having a film thickness of 40 nm is formed by sputtering. Then, a photoresist film is formed on throughout the surface by spin coating. After that, a photolithography technique is used to pattern the photoresist film. In this manner, a photoresist mask is formed to pattern a source electrode 28 and a drain electrode 63.

Subsequently, the MoN film 64, the Al film 65 and the MoN film 66 are etched at the same time. For an etching solution, for example, an aqueous solution mixed with 67.3 wt % of phosphoric acid, 5.2 wt % of nitric acid and 10 wt % of acetic acid is used. Furthermore, a gas of fluorine plus chlorine is used to dry etch the n$^+$-amorphous silicon film 36 for half etching the amorphous silicon film 34. In this manner, the source electrode 28 and the drain electrode 63 are formed.

Subsequently, the photoresist mask is removed by a resist remover. Then, a protective film 42 formed of SiN having a film thickness of 330 nm is formed by plasma CVD. Subsequently, a photoresist film is formed on throughout the surface by spin coating. After that, a photolithography technique is used to pattern the photoresist film to form a photoresist mask having an opening formed therein. Subsequently, the photoresist mask is used to etch the protective film 42 to form a contact hole 46 which reaches the source electrode 28. Then, the photoresist mask is removed by a resist remover.

Subsequently, an ITO film having a film thickness of 70 nm is formed on throughout the surface by sputtering. Then, a photoresist film is formed on throughout the surface by spin coating. Subsequently, a photolithography technique is used to pattern the photoresist film. In this manner, a photoresist mask is formed to form a pixel electrode 37.

Subsequently, the ITO film is etched to form a pixel electrode 37 formed of ITO. The Al film 65 is connected to the pixel electrode 37 through the MoN film 66 and the contact hole 46, and an excellent electric contact can be provided between the Al film 65 and the pixel electrode 37. Then, the photoresist mask is removed by a resist remover. In this manner, the TFT substrate 1 of the embodiment is formed.

As described above, the TFT substrate 1 of the embodiment can form the gate insulating film 32 on the gate electrode 33 whose side surface inclines gently, and it can prevent the film quality of the gate insulating film 32 from being discontinued near the side of the gate electrode 33. Accordingly, the same advantage as that of the embodiment can be obtained.

Third Embodiment

Figure 5:
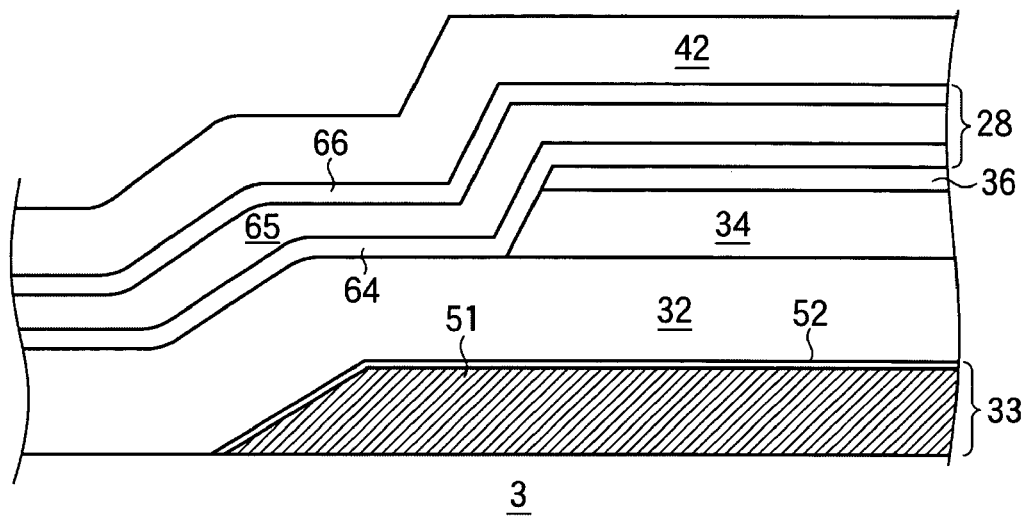
FIG. 5 is a diagram illustrating the sectional configuration of a single pixel of a TFT substrate 1 of a third embodiment according to the invention.

Next, a thin film transistor substrate and a method of fabricating the same of a third embodiment according to the invention will be described with reference to FIG. 5. The plane pixel configuration of a TFT substrate 1 and the schematic configuration of a liquid crystal display device of the embodiment are the same as those of the embodiment above, omitting the description. FIG. 5 shows a cross section illustrating the TFT substrate 1 of the embodiment sectioned at a dashed line A-A' shown in FIG. 11.

First, an AlN film 51 is formed as a nitrogen containing layer having a film thickness of 150 nm, for example, on throughout the surface of a glass substrate 3 by reactive sputtering using $N_2$ gas. In addition, in the embodiment, the nitrogen containing layer is a main wiring layer. For the film deposition condition, the flow ratio of Ar gas to $N_2$ gas is changed over time. For example, the flow ratio of Ar gas to $N_2$ gas is changed from Ar gas to $N_2$ gas=6:4 to 10:0. Thus, the AlN film 51 has a nitriding ratio increasing toward the glass substrate 3 side.

Subsequently, a photoresist film is formed on throughout the surface by spin coating. Then, a photolithography technique is used to pattern the photoresist film. Subsequently, the AlN film 51 is wet etched. For an etching solution, for example, an aqueous solution mixed with 67.3 wt % of phosphoric acid, 5.2 wt % of nitric acid and 10 wt % of acetic acid is used. With the use of the etching solution like this, a gate electrode 33 can be formed in which the side is shaped to incline gently in the drawing.

Subsequently, the photoresist mask is removed by a resist remover. Then, an oxide film (AlO film 52) is formed as an oxidized layer having a film thickness of 50 nm on the surfaces of the gate electrode 33 and a gate bus line 6 by anodic oxidation. For the method of forming the AlO film 52, an ashing process, a high-pressure oxidation process and a thermal oxidation process may be used instead of anodic oxidation process. Subsequently, a gate insulating film 32 formed of SiN having a film thickness of 350 nm is formed on throughout the surface by plasma CVD. Since the gate insulating film 32 is formed on the gate electrode 33 whose side surface inclines gently, the gate insulating film 32 of excellent film quality can be obtained. Therefore, the gate insulating film 32 of high reliability and high withstand voltage can be formed.

Subsequently, an amorphous silicon film 34 having a film thickness of 120 nm is formed on throughout the surface by plasma CVD. Then, an $n^+$-amorphous silicon film 36 having a film thickness of 30 nm is formed on throughout the surface by plasma CVD. Subsequently, a photoresist film is formed on throughout the surface by spin coating. After that, a photolithography technique is used to pattern the photoresist film. In this manner, a photoresist film is formed to pattern the $n^+$-amorphous silicon film 36. Subsequently, the $n^+$-amorphous silicon film 36 is etched by dry etching. Then, the photoresist mask is removed by a resist remover.

Subsequently, an MoN film 64 having a film thickness of 50 nm is formed by sputtering. Then, an Al film 65 having a film thickness of 100 nm is formed by sputtering. Subsequently, an MoN film 66 having a film thickness of 40 nm is formed by sputtering. Then, a photoresist film is formed on throughout the surface by spin coating. After that, a photolithography technique is used to pattern the photoresist film. In this manner, a photoresist mask is formed to pattern a source electrode 28 and a drain electrode 63.

Subsequently, the MoN film 64, the Al film 65 and the MoN film 66 are etched at the same time. For an etching solution, for example, an aqueous solution mixed with 67.3 wt % of phosphoric acid, 5.2 wt % of nitric acid and 10 wt % of acetic acid is used. Furthermore, a gas of fluorine plus chlorine is used to dry etch the $n^+$-amorphous silicon film 36 for half etching the amorphous silicon film 34. In this manner, the source electrode 28 and the drain electrode 63 are formed. Subsequently, the photoresist mask is removed by a resist remover.

Then, a protective film 42 formed of SiN having a film thickness of 330 nm is formed by plasma CVD. Subsequently, a photoresist film is formed on throughout the surface by spin coating. After that, a photolithography technique is used to pattern the photoresist film to form a photoresist mask having an opening formed therein. Subsequently, the photoresist mask is used to etch the protective film 42 to form a contact hole 46 which reaches the source electrode 28. Then, the photoresist mask is removed by a resist remover.

Subsequently, an ITO film having a film thickness of 70 nm is formed on throughout the surface by sputtering. Then, a photoresist film is formed on throughout the surface by spin coating. Subsequently, a photolithography technique is used to pattern the photoresist film. In this manner, a photoresist mask is formed to form a pixel electrode 37.

Then, the ITO film is etched to form the pixel electrode 37 formed of ITO. The Al film 65 is connected to the pixel electrode 37 through the MoN film 66 and the contact hole 46, and an excellent electric contact can be provided between the Al film 65 and the pixel electrode 37. Subsequently, the photoresist mask is removed by a resist remover. In this manner, the TFT substrate 1 of the embodiment is formed.

As described above, the TFT substrate 1 of the embodiment can form the gate insulating film 32 on the gate electrode 33 whose side surface inclines gently, and it can prevent the film quality of the gate insulating film 32 from being discontinued near the side of the gate electrode 33. Accordingly, the same advantage as that of the embodiment can be obtained.

Fourth Embodiment

Figure 6:
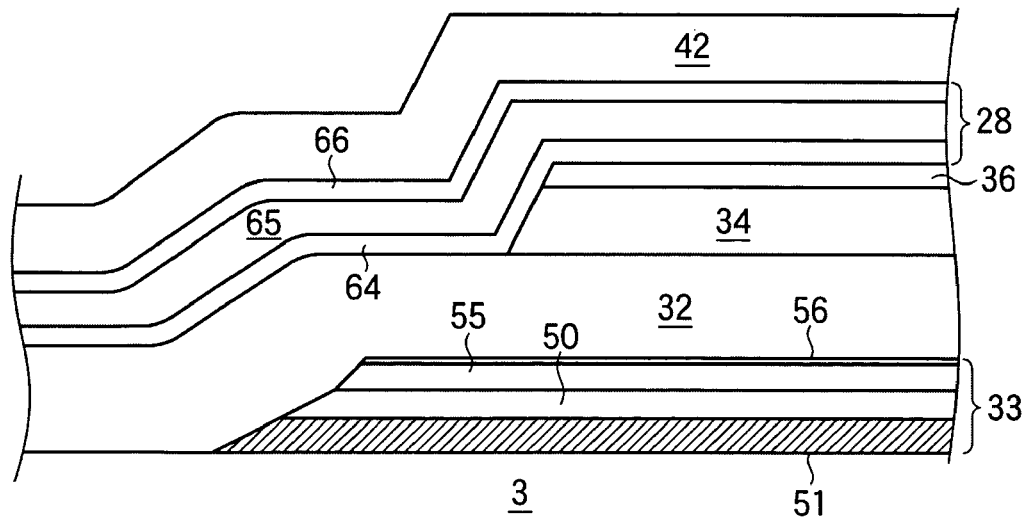
FIG. 6 is a diagram illustrating the sectional configuration of a single pixel of a TFT substrate 1 of a fourth embodiment according to the invention.

Next, a thin film transistor substrate and a method of fabricating the same of a fourth embodiment according to the invention will be described with reference to FIG. 6. The plane pixel configuration of a TFT substrate 1 and the schematic configuration of a liquid crystal display device of the embodiment are the same as those of the embodiment above, omitting the description. FIG. 6 shows a cross section illustrating the TFT substrate 1 of the embodiment sectioned at a dashed line A-A' shown in FIG. 11.

First, an AlN film 51 is formed as a nitrogen containing layer having a film thickness of 100 nm, for example, on throughout the surface of a glass substrate 3 by reactive sputtering using $N_2$ gas. For the film deposition condition, the flow ratio of Ar gas to $N_2$ gas is changed over time. For example, the flow ratio of Ar gas to $N_2$ gas is changed from Ar gas to $N_2$ gas=6:4 to 10:0. The AlN film 51 has a nitriding ratio increasing toward the glass substrate 3 side.

Subsequently, an Al film 50 is formed as a main wiring layer having a film thickness of 100 nm, for example, on throughout the surface by sputtering. Then, a photoresist film is formed on throughout the surface by spin coating. Subsequently, a photolithography technique is used to pattern the photoresist film. Then, the AlN film 51 and the Al film 50 are wet etched at the same time. For an etching solution, for example, an aqueous solution mixed with 67.3 wt % of phosphoric acid, 5.2 wt % of nitric acid and 10 wt % of acetic acid is used. With the use of the etching solution like this, the sides of the AlN film 51 and the Al film 50 can be shaped as they incline gently in the drawing.

Subsequently, a Ti film 55 having a film thickness of 70 nm is formed on throughout the surface by sputtering. Then, a TiN film 56 having a film thickness of 10 nm is formed on throughout the surface by reactive sputtering using $N_2$ gas. For the film deposition condition, the flow ratio of Ar gas to $N_2$ gas is set to 8:2, for example. Thus, an upper wiring layer formed of the TiN film 56 and the Ti film 55 is formed. Subsequently, a photoresist film is formed on throughout the surface by spin coating. Then, a photolithography technique is used to pattern the photoresist film. Subsequently, the TiN film 56 and the Ti film 55 are etched in this order by dry etching using a chlorine gas. Then, the photoresist mask is removed by a resist remover. In this manner, a gate electrode 33 whose side surface inclines gently can be formed.

Subsequently, a gate insulating film 32 formed of SiN having a film thickness of 350 nm is formed on throughout the surface by plasma CVD. Since the gate insulating film 32 is formed on the gate electrode 33 whose side surface inclines gently, the gate insulating film 32 of excellent film quality can be obtained. Therefore, the gate insulating film 32 of high reliability and high withstand voltage can be formed.

Subsequently, an amorphous silicon film 34 having a film thickness of 120 nm is formed on throughout the surface by plasma CVD. Then, an $n^+$-amorphous silicon film 36 having a film thickness of 30 nm is formed on throughout the surface by plasma CVD. Subsequently, a photoresist film is formed on throughout the surface by spin coating. After that, a photolithography technique is used to pattern the photoresist film. In this manner, a photoresist mask is formed to pattern the $n^+$-amorphous silicon film 36. Subsequently, the $n^+$-amorphous silicon film 36 is etched by dry etching. Then, the photoresist mask is removed by a resist remover.

Subsequently, an MoN film 64 having a film thickness of 50 nm is formed by sputtering. Then, an Al film 65 having a film thickness of 100 nm is formed by sputtering. Subsequently, an MoN film 66 having a film thickness of 40 nm is formed by sputtering. Then, a photoresist film is formed on throughout the surface by spin coating. After that, a photolithography technique is used to pattern the photoresist film. In this manner, a photoresist mask is formed to pattern a source electrode 28 and a drain electrode 63.

Subsequently, the MoN film 64, the Al film 65 and the MoN film 66 are etched at the same time. For an etching solution, for example, an aqueous solution mixed with 67.3 wt % of phosphoric acid, 5.2 wt % of nitric acid and 10 wt % of acetic acid is used. Furthermore, a gas of fluorine plus chlorine is used to dry etch the $n^+$-amorphous silicon film 36 for half etching the amorphous silicon film 34. In this manner, the source electrode 28 and the drain electrode 63 are formed. Subsequently, the photoresist mask is removed by a resist remover.

Then, a protective film 42 formed of SiN having a film thickness of 330 nm is formed by plasma CVD. Subsequently, a photoresist film is formed on throughout the surface by spin coating. After that, a photolithography technique is used to pattern the photoresist film to form a photoresist mask having an opening formed therein. Subsequently, the photoresist mask is used to etch the protective film 42 to form a contact hole 46 which reaches the source electrode 28. Then, the photoresist mask is removed by a resist remover.

Subsequently, an ITO film having a film thickness of 70 nm is formed on throughout the surface by sputtering. Then, a photoresist film is formed on throughout the surface by spin coating. Subsequently, a photolithography technique is used to pattern the photoresist film. In this manner, a photoresist mask is formed to form a pixel electrode 37. Subsequently, the ITO film is etched to form a pixel electrode 37 formed of ITO. The Al film 65 is connected to the pixel electrode 37 through the MoN film 66 and the contact hole 46, and an excellent electric contact can be provided between the Al film 65 and the pixel electrode 37. Subsequently, the photoresist mask is removed by a resist remover. In this manner, the TFT substrate 1 of the embodiment is formed.

As described above, the TFT substrate 1 of the embodiment can form the gate insulating film 32 on the gate electrode 33 whose side surface inclines gently, and it can prevent the film quality of the gate insulating film 32 from being discontinued near the side of the gate electrode 33. Accordingly, the same advantage as that of the embodiment can be obtained.

Fifth Embodiment

Figure 7:
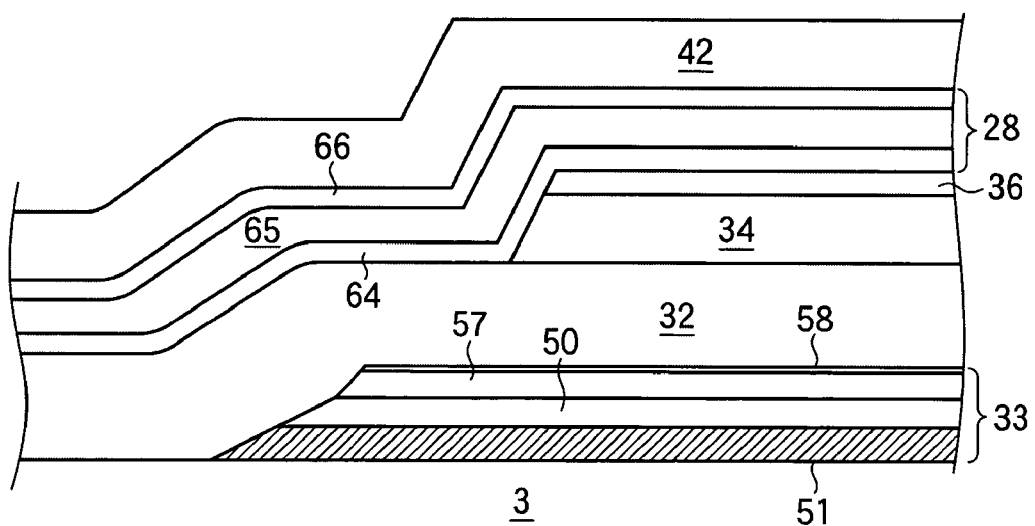
FIG. 7 is a diagram illustrating the sectional configuration of a single pixel of a TFT substrate 1 of a fifth embodiment according to the invention.

Next, a thin film transistor substrate and a method of fabricating the same of a fifth embodiment according to the invention will be described with reference to FIG. 7. The plane pixel configuration of a TFT substrate 1 and the schematic configuration of a liquid crystal display device of the embodiment are the same as those of the embodiment above, omitting the description. FIG. 7 shows a cross section illustrating the TFT substrate 1 of the embodiment sectioned at a dashed line A-A' shown in FIG. 11.

First, an AlN film 51 is formed as a nitrogen containing layer having a film thickness of 100 nm, for example, on throughout the surface of a glass substrate 3 by reactive sputtering using $N_2$ gas. For the film deposition condition, the flow ratio of Ar gas to $N_2$ gas is changed over time. For example, the flow ratio of Ar gas to $N_2$ gas is changed from Ar gas to $N_2$ gas=6:4 to 10:0. The AlN film 51 has a nitriding ratio increasing toward the glass substrate 3 side.

Subsequently, an Al film 50 having a film thickness of 100 nm is formed on throughout the surface by sputtering. Then, a Cr film 57 having a film thickness of 70 nm is formed on throughout the surface by sputtering. Subsequently, a CrN film 58 having a film thickness of 5 nm is formed by reactive sputtering using $N_2$ gas. For the film deposition condition, the flow ratio of Ar gas to $N_2$ gas is set to 6:4, for example. Thus, an upper wiring layer formed of the CrN film 58 and the Cr film 57 is formed. In this manner, a gate electrode 33 and a gate bus line 6 in the multilayer structure are configured (see FIG. 11).

Subsequently, a photoresist film is formed on throughout the surface by spin coating. Then, a photolithography technique is used to pattern the photoresist film. Subsequently, the CrN film 51 and the Cr film 50 are wet etched at the same time. For an etching solution, for example, an aqueous solution mixed with 15 wt % of cerium diammonium nitrate, 15 wt % of nitric acid and 5 wt % of ammonium nitrate is used. Subsequently, the AlN film 51 and the Al film 50 are wet etched at the same time. For an etching solution, for example, an aqueous solution mixed with 67.3 wt % of phosphoric acid, 5.2 wt % of nitric acid and 10 wt % of acetic acid is used. With the use of the etching solution like this, the gate electrode 33 can be shaped in which the side surface inclines gently in the drawing. Subsequently, the photoresist mask is removed by a resist remover.

Then, a gate insulating film 32 formed of SiN having a film thickness of 350 nm is formed on throughout the surface by plasma CVD. Since the gate insulating film 32 is formed on the gate electrode 33 whose side surface inclines gently, the gate insulating film 32 of excellent film quality can be formed. Therefore, the gate insulating film 32 of high reliability and high withstand voltage can be formed.

Subsequently, an amorphous silicon film 34 having a film thickness of 120 nm is formed on throughout the surface by plasma CVD. Then, an n⁺-amorphous silicon film 36 having a film thickness of 30 nm is formed on throughout the surface by plasma CVD. Subsequently, a photoresist film is formed on throughout the surface by spin coating. After that, a photolithography technique is used to pattern the photoresist film. In this manner, a photoresist mask is formed to pattern the n⁺-amorphous silicon film 36. Subsequently, the n⁺-amorphous silicon film 36 is etched by dry etching. Then, the photoresist mask is removed by a resist remover.

Subsequently, an MoN film 64 having a film thickness of 50 nm is formed by sputtering. Then, an Al film 65 having a film thickness of 100 nm is formed by sputtering. Subsequently, an MoN film 66 having a film thickness of 40 nm is formed by sputtering. Then, a photoresist film is formed on throughout the surface by spin coating. After that, a photolithography technique is used to pattern the photoresist film. In this manner, a photoresist mask is formed to pattern a source electrode 28 and a drain electrode 63.

Subsequently, the MoN film 64, the Al film 65 and the MoN film 66 are etched at the same time. For an etching solution, for example, an aqueous solution mixed with 67.3 wt % of phosphoric acid, 5.2 wt % of nitric acid and 10 wt % of acetic acid is used. Furthermore, a gas of fluorine plus chlorine is used to dry etch the n⁺-amorphous silicon film 36 for half etching the amorphous silicon film 34. In this manner, the source electrode 28 and the drain electrode 63 are formed. Subsequently, the photoresist mask is removed by a resist remover.

Then, a protective film 42 formed of SiN having a film thickness of 330 nm is formed by plasma CVD. Subsequently, a photoresist film is formed on throughout the surface by spin coating. After that, a photolithography technique is used to pattern the photoresist film to form a photoresist mask having an opening formed therein. Subsequently, the photoresist mask is used to etch the protective film 42 to form a contact hole 46 which reaches the source electrode 28. Then, the photoresist mask is removed by a resist remover.

Subsequently, an ITO film having a film thickness of 70 nm is formed on throughout the surface by sputtering. Then, a photoresist film is formed on throughout the surface by spin coating. Subsequently, a photolithography technique is used to pattern the photoresist film. In this manner, a photoresist mask is formed to form the pixel electrode 37. Subsequently, the ITO film is etched to form a pixel electrode 37 formed of ITO. The Al film 65 is connected to the pixel electrode 37 through the MoN film 66 and the contact hole 46, and an excellent electric contact can be provided between the Al film 65 and the pixel electrode 37. Subsequently, the photoresist mask is removed by a resist remover. In this manner, the TFT substrate 1 of the embodiment is formed.

As described above, the TFT substrate 1 of the embodiment can form the gate insulating film 32 on the gate electrode 33 whose side surface inclines gently, and it can prevent the film quality of the gate insulating film 32 from being discontinued near the side of the gate electrode 33. Accordingly, the same advantage as that of the embodiment can be obtained.

Sixth Embodiment

Next, a thin film transistor substrate and a method of fabricating the same of a sixth embodiment according to the invention will be described with reference to FIGS. 8A to 10B. The plane pixel configuration of the TFT substrate 1 and the schematic configuration of a liquid crystal display device of the embodiment are the same as those of the embodiment above, omitting the description. FIGS. 8A to 10B show cross sections illustrating fabrication process steps of a gate electrode and a gate bus line (scanning line) in the TFT substrate 1 of the embodiment.

Figure 8A:
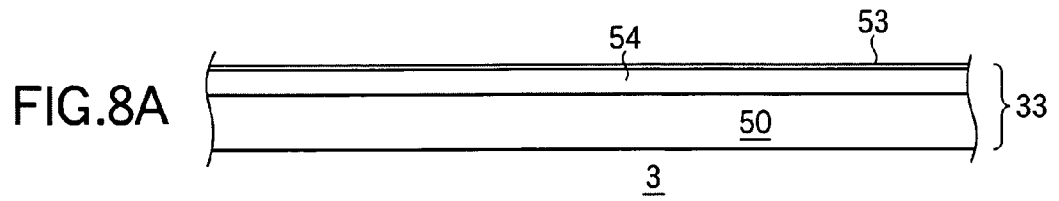
FIGS. 8A to 8D are diagrams illustrating cross sections of fabrication process steps of a TFT substrate 1 of a sixth embodiment according to the invention.
Figure 8B:
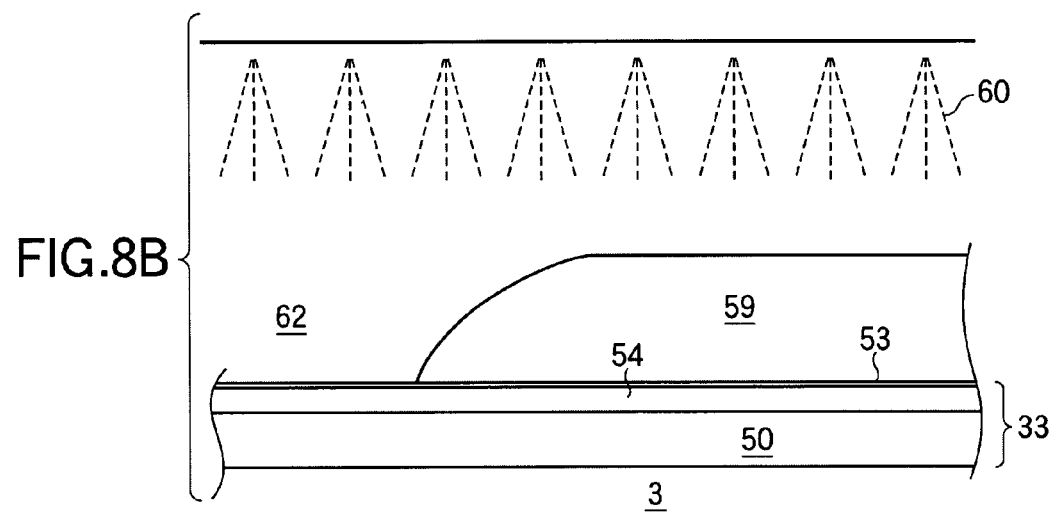

First, as shown in FIG. 8A, an Al film 50 having a film thickness of 150 nm, for example, is formed as a main wiring layer on throughout the surface of the glass substrate 3 by sputtering. Subsequently, an MoN film 54 having a film thickness of 70 nm is formed by reactive sputtering using N₂ gas. For the film deposition condition, for example, the flow ratio of Ar gas to N₂ gas is set to 7:3. Subsequently, an Mo film 53 having a film thickness of 15 nm is formed on throughout the surface by sputtering. In this manner, the gate electrode and the scanning line in the multilayer structure are configured.

Subsequently, a photoresist film 59 is formed on throughout the surface by spin coating. Then, photolithography technique is used to pattern the photoresist film 59. Subsequently, the Al film 50, the MoN film 54 and the Mo film 53 are wet etched at the same time. For an etching solution, for example, an aqueous solution mixed with 67.3 wt % of phosphoric acid, 5.2 wt % of nitric acid and 10 wt % of acetic acid is used. Spray etching is first performed for 60 seconds (see FIG. 8B), and the Al film 50, the MoN film 54 and the Mo film 53 are removed. On this occasion, in the drawing, the sides of the Al film 50, the MoN film 54 and the Mo film 53 are not tapered, and are almost in a vertical etched shape (see FIG. 8C).

Figure 8C:
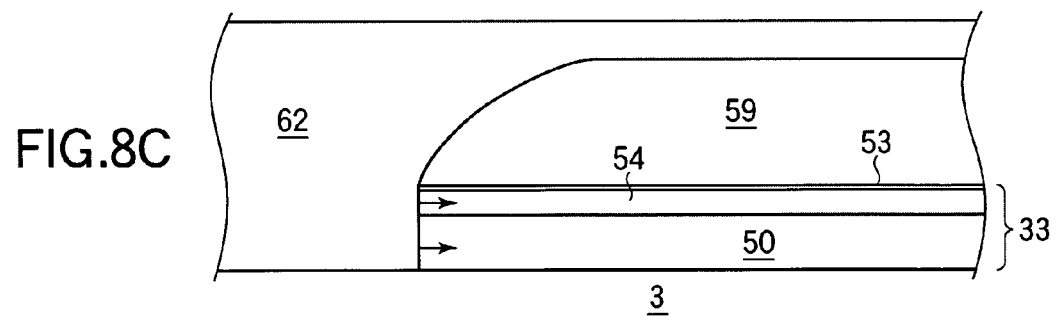
Figure 8D:
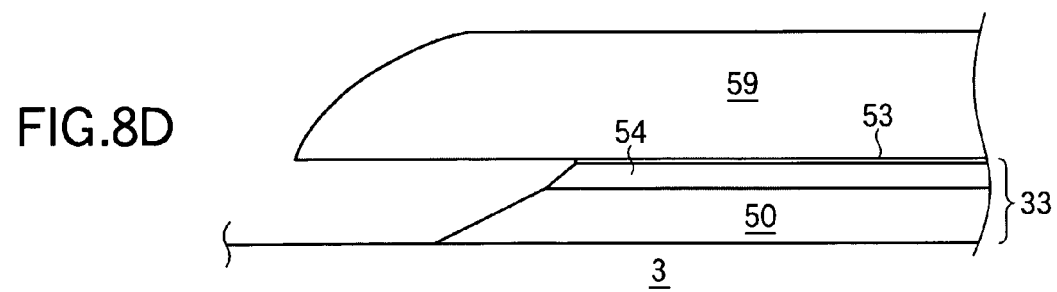
Figure 9A:
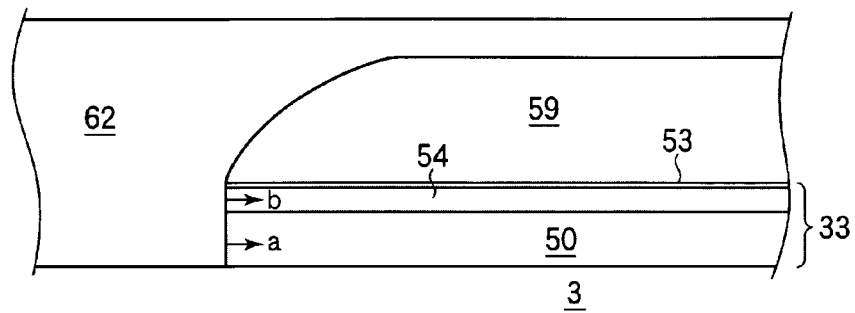
FIGS. 9A to 9D are diagrams illustrating cross sections of fabrication process steps of the TFT substrate 1 of the sixth embodiment according to the invention.
Figure 9B:
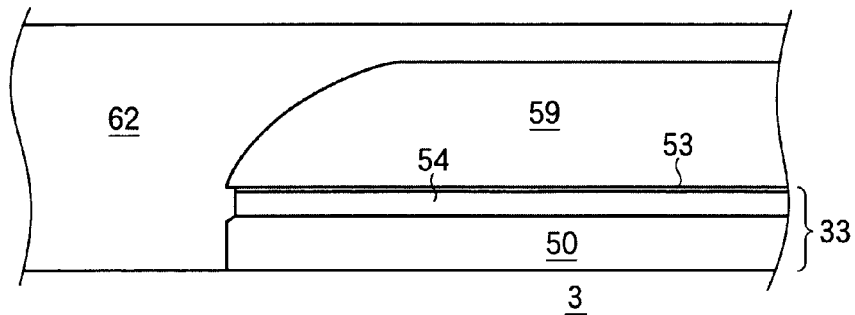
Figure 9C:
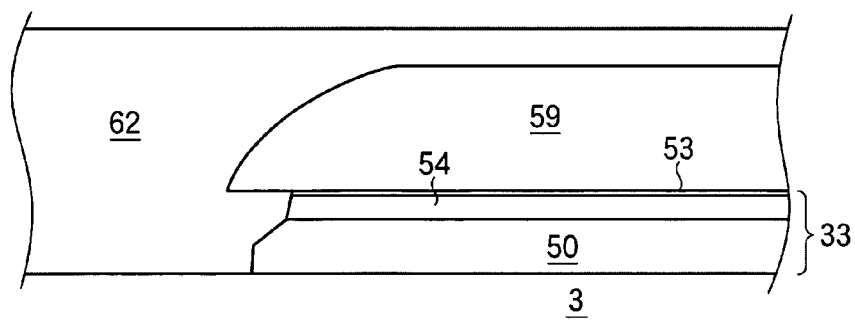
Figure 9D:
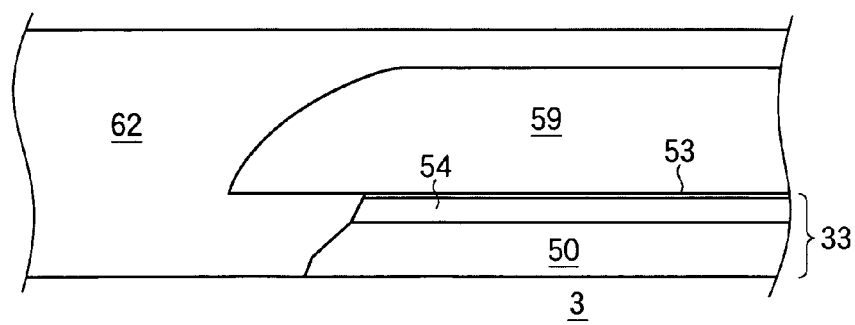

Then, as shown by arrows in FIG. 8C, dip etching is performed. As shown in FIG. 8D, since the upper films (the MoN film 54 and the Mo film 53) have a faster etching rate than that of the lower Al film 50, a normal tapered etching shape is formed on the sides of the Al film 50, the MoN film 54 and the Mo film 53 in the drawing. However, depending on the ratio of the etching rates of the upper film to the lower film, an excellent etching shape cannot be obtained. In addition, the etching shape is also affected by the etching time.

Next, dip etching described in FIG. 8C will be described in detail with reference to FIGS. 9A to 10B. In dip etching, the relationship between the etching rates is a<b, where the etching rate of the lower Al film 50 is a, and the etching rate of the upper MoN film 54 is b. Therefore, as shown in FIGS. 9A to 9D, the Al film 50, the MoN film 54 and Mo film 53 are sequentially changed in their etching shapes as the etching time elapses. Accordingly, the normal tapered etching shape shown in FIG. 8D is formed on the sides of the Al film 50, the MoN film 54 and Mo film 53.

Figure 10A:
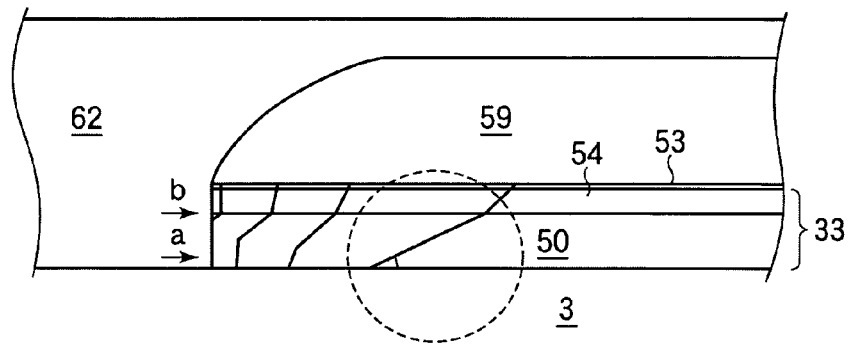
FIGS. 10A and 10B are diagrams illustrating cross sections of fabrication process steps of the TFT substrate 1 of the sixth embodiment according to the invention.

Next, an excellent etching shape of the sides of the Al film 50, the MoN film 54 and Mo film 53 shown in FIG. 8D will be described in detail with reference to FIGS. 10A and 10B. As described in FIGS. 9A to 9D, the laminated film having different etching rates is dip etched to obtain an excellent etching shape. Here, suppose the dip etching time is t, the etching rate of the lower Al film 50 is a, the etching rate of the upper MoN film 54 is b, the film thickness of the lower Al film 50 is D, and the size of the taper part of the lower Al film 50 is L. Then, the etched amount of the lower Al film 50 is at, and the etched amount of the upper film the MoN film 54 is bt.

Figure 10B:
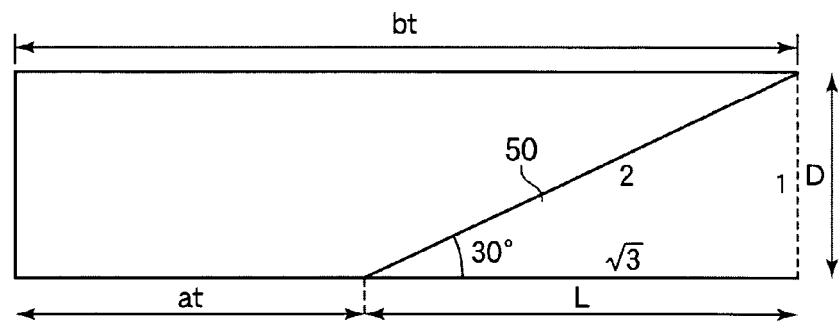

Thus, as shown in FIG. 10B, the size of the taper part of the lower Al film 50 is as follows:

$$L = bt - at \quad (1)$$

In addition, the etched amount of the lower Al film 50 in the film thickness direction is as follows:

$$D = at \quad (2)$$

The etching shape at an angle of 30 degrees or less is excellent with respect to the withstand voltage and the leakage for the gate insulating film. The relationship between L and D is determined by the Pythagorean theorem, and then it is as follows:

$$\sqrt{3}D \leq L \quad (3)$$

Equation (1) is substituted in Equation (3), and then it is as follows:

$$\sqrt{3}at \leq bt - at \quad (4)$$

Since $b \geq a(\sqrt{3}+1)$ is found by Equation (4), the relationship of $b \geq 2.7\,a$ is held between a and b. Therefore, the condition for the etching rate of the upper MoN film 54 is 2.7 times or greater than the etching rate of the lower Al film 50.

In addition, for the etching time, it requires the time equal to or more than the time that finishes the etching amount in the film thickness direction of the lower Al film 50, and the time for $t \leq D/a$ is required by Equation (2). By satisfying these conditions, an excellent etching shape can be obtained.

As described above, in dip etching the Al film 50 (the main wiring layer material film in the multilayer structure), the MoN film 54 and the Mo film 53 (the upper wiring layer material films), it is ensured that the relationship of $b \geq 2.7\,a$ is held between the etching rate a of the lower Al film 50 and the etching rate b of the upper film the MoN film 54b. In addition, it is ensured that the relationship of $D/a \geq t \geq 1.5\ \mu m/(b-a)$ is held among the etching rate a of the lower Al film 50 and the etching rate b of the upper MoN film 54, the dip etching time t, and the film thickness D of the lower Al film 50. Therefore, since the gate electrode 33 can be formed in which the side surfaces of the Al film 50, the MoN film 54 and the Mo film 53 incline gently, the film quality of the gate insulating film 32 formed thereon can be prevented from being discontinued near the side of the gate electrode 33. Accordingly, the gate insulating film of high reliability and high withstand voltage can be formed, and consequently the TFT 2 and the TFT substrate 1 of high reliability can be provided.

As described above, according to the first to the sixth embodiments, the gate electrode 33 can be configured in which the AlN film 51 is etched at the etching rate faster than that of the Al film 50 and the Al film 50 is etched at the etching rate faster than that of the MoN film 54 and the Mo film 53. Therefore, the side of the gate electrode 33 can be formed as it inclines gently. In addition, in etching the Al film 50 and the MoN film 54, the etching rate and the etching time for each layer are optimized to provide the shape in which the side surface of the gate electrode 33 inclines gently.

Since the gate insulating film 32 is formed on the gate electrode 33 in which the side surface inclines gently to improve the wiring structure, the film quality of the gate insulating film 32 can be prevented from being discontinued near the side of the gate electrode 33. Accordingly, the gate insulating film 32 of high reliability and high withstand voltage can be formed, and consequently the TFT 2 and the TFT substrate 1 of high reliability can be provided.

In addition, according to the first to the sixth embodiments, the same technique as the gate electrode 33 can be adapted not only to the gate electrode 33 but also the source electrode 28 and the drain electrode 63. The source electrode 28 and the drain electrode 63 can be formed in which the side surfaces incline gently. Since the protective film 42 is formed on the source electrode 28 and the drain electrode 63 like these, the film quality of the protective film 42 can be prevented from being discontinued near the sides of the source electrode 28 and the drain electrode 63. Accordingly, the withstand voltage of the protective film 42 is increased to improve the reliability, and consequently the reliability of the liquid crystal display device can be improved.

The invention is not limited to the embodiments described above, which can be modified variously. In the first to the sixth embodiments, Al is used for the main wiring layer, but the invention is not limited thereto. For example, even though Ag or Cu is used for the main wiring layer, the same advantage can be obtained.

In addition, in the first to the sixth embodiments, Al is used for the main wiring layer, but the invention is not limited thereto. For example, even though alloys having a main component of Al, Ag and Cu are used for the main wiring layer, the same advantage as that of the embodiment can be obtained.

In addition, in the first, the second and the sixth embodiments, Mo is used for the upper wiring layer material film formed on the main wiring layer. In the fourth embodiment, Ti is used for the upper wiring layer material film, and in the fifth embodiment, Cr is used for the upper wiring layer material film. However, the invention is not limited thereto. For example, even though W or Ta is used for the upper wiring layer material film, the same advantage as that of the embodiment can be obtained.

In addition, in the first to the sixth embodiments, a metal material such as Mo is used for the upper wiring layer material film formed on the main wiring layer, but the invention is not limited thereto. For example, even though alloys of Ti, Mo, W, Cr and Ta are used for the upper wiring layer, the same advantage as that of the embodiment can be obtained.

What is claimed is:

1. A thin film transistor substrate comprising:
on an insulating substrate,
at least a gate electrode,
a scanning line connected to the gate electrode,
a gate insulating film,
a semiconductor layer,
a source electrode, a drain electrode, and
a signal line connected to the drain electrode,
wherein the gate electrode and/or the scanning line has a multilayer structure configured of a main wiring layer formed of a metal selected from Al, Ag and Cu or an alloy having a main component of Al, Ag and Cu, and of a nitrogen containing layer which is disposed below the main wiring layer and has nitrogen contained in the main wiring layer,
wherein the main wiring layer and the nitrogen containing layer are formed such that respective side surfaces incline gently from the upper surface of the main wiring layer toward a lower layer.

2. The thin film transistor substrate according to claim 1, wherein the nitrogen containing layer has different nitriding ratios in the layer.

3. The thin film transistor substrate according to claim 2, wherein the nitrogen containing layer is formed to increase a nitriding ratio toward the lower layer.

4. A thin film transistor substrate comprising:
on an insulating substrate,
at least a gate electrode,
a scanning line connected to the gate electrode,
a gate insulating film,
a semiconductor layer,
a source electrode,
a drain electrode, and
a signal line connected to the drain electrode,
wherein the gate electrode and/or the scanning line is a main wiring layer which is formed of a metal selected from Al, Ag and Cu or an alloy having a main component of Al, Ag and Cu, which contains nitrogen, which has different nitriding ratios in the main wiring layer, and which a nitriding ratio increasing toward the lower layer, wherein sides of the gate electrode and/or scanning line incline gently from the top surface of the main wiring layer toward the lower layer.

5. The thin film transistor substrate according to claim 1, wherein the gate electrode and the scanning line have a multilayer structure in which at least one layer of upper wiring layers of a metal selected from Ti, Mo, W, Cr and Ta, or an alloy of Ti, Mo, W, Cr and Ta, or a material having nitrogen contained in Ti, Mo, W, Cr and Ta is further disposed on the main wiring layer.

6. The thin film transistor substrate according to claim 1, wherein the gate electrode and the scanning line have a topmost layer which is an oxidized layer of the main wiring layer.

* * * * *